United States Patent
Ogle et al.

(10) Patent No.: US 7,863,175 B2
(45) Date of Patent: Jan. 4, 2011

(54) ZERO INTERFACE POLYSILICON TO POLYSILICON GATE FOR FLASH MEMORY

(75) Inventors: Robert Bertram Ogle, San Jose, CA (US); Joong Jeon, Los Altos, CA (US); Eric Paton, Morgan Hill, CA (US); Austin Frenkel, San Jose, CA (US)

(73) Assignees: Spansion LLC, Sunnyvale, CA (US); Globalfoundries Inc., Grand Cayman, KY (US)

( * ) Notice: Subject to any disclaimer, the term of this patent is extended or adjusted under 35 U.S.C. 154(b) by 935 days.

(21) Appl. No.: 11/614,801

(22) Filed: Dec. 21, 2006

(65) Prior Publication Data

US 2008/0149986 A1    Jun. 26, 2008

(51) Int. Cl.
*H01L 21/8247* (2006.01)
*H01L 29/788* (2006.01)

(52) U.S. Cl. ............... 438/592; 257/315; 257/E21.209; 438/257

(58) Field of Classification Search .................. 438/592
See application file for complete search history.

(56) References Cited

U.S. PATENT DOCUMENTS 5,972,804 A * 10/1999 Tobin et al. .................. 438/786
6,436,760 B1 * 8/2002 Wong et al. .................. 438/243

OTHER PUBLICATIONS

Abdul-Rahim et al "Improved control of polysilicon emitter . . . cluster tool" 1997 IEEE 0-7803-4135-X/97/.*

* cited by examiner

*Primary Examiner*—Jerome Jackson, Jr.
(74) *Attorney, Agent, or Firm*—Turocy & Watson, LLP

(57) ABSTRACT

A system and method are disclosed for processing a zero angstrom oxide interface dual poly gate structure for a flash memory device. An exemplary method can include removing an oxide on a surface of a first poly layer and forming a second poly layer on the first poly layer in a same processing chamber. A transfer of the structure is not needed from an oxide removal tool to, for example, a poly layer formation tool, an implant tool, and the like. As a result, impurities containing a silicon oxide caused by exposure of the first poly layer to an oxygen-containing atmosphere do not form at the interface of the first and second poly layers.

4 Claims, 5 Drawing Sheets

ZERO INTERFACE POLYSILICON TO POLYSILICON GATE FOR FLASH MEMORY

TECHNICAL FIELD

The subject invention generally relates to zero angstrom oxide interface poly to poly gate for use in connection with flash memory devices.

BACKGROUND

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the erasing of all memory cells in the device using a single current pulse.

A flash memory device typically includes a core region and a periphery region. The core region includes memory transistors, while the periphery region contains both low-voltage transistors for handling logic and switching circuitry, and high-voltage transistors for handling high-voltages encountered during flash memory programming and erase operations.

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller feature sizes and more precise feature shapes are required. This may include the width, thickness and spacing of interconnecting lines, spacing and diameter of contact holes, and the surface geometry, such as corners and edges, of various features.

The requirement of small features with close spacing between adjacent features requires sophisticated manufacturing techniques to ensure that quality and operability of the features are not compromised for the purpose of reducing feature size. Among the many aspects related to improving flash memory device fabrication processing to achieve higher density devices, the ability to form thin films, which are substantially free from impurities and defects, remains critical to the structural integrity of smaller features as well as to the performance of the device with respect to increasing the speed of the device. Even minor impurities or defects present in thin films tend to result in poor device characteristics, thereby reducing the effectiveness of the flash memory device.

SUMMARY

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides a method and system that facilitates processing a zero angstrom oxide interface dual poly gate structure for a flash memory device. The method can include removing an oxide and/or oxide layer on the surface of a first poly layer and forming a second poly layer on the first poly layer in the same processing chamber. A transfer of the structure is not needed from an oxide removal tool to, for example, a poly layer formation tool, an implant tool, and the like. As a result, the substrate is not exposed to an oxygen-containing atmosphere after removal of the oxide layer from the first poly layer and before formation of the second poly layer. Consequently, impurities containing a silicon oxide caused by exposure of the first poly layer to an oxygen-containing atmosphere do not form at the interface of the first and second poly layers, thus improving productivity, quality, and reliability of the resultant flash memory devices.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
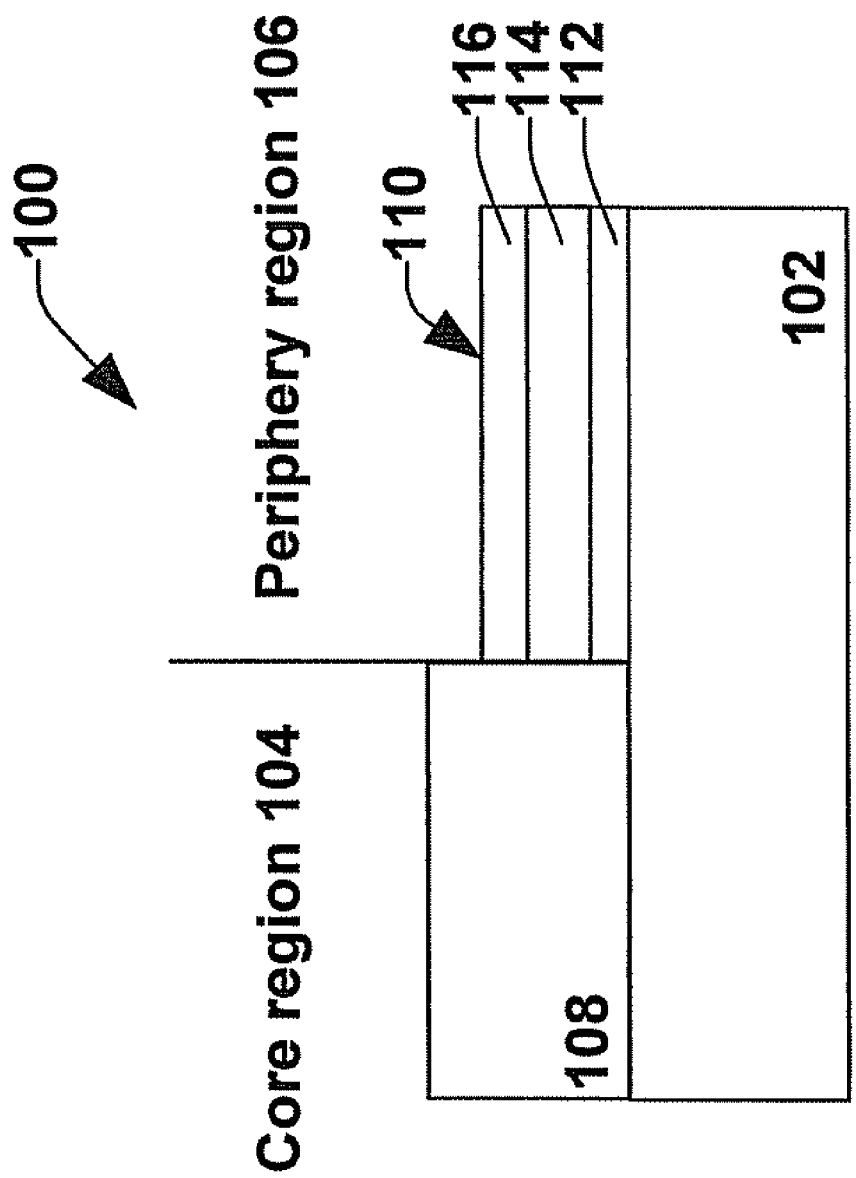
FIG. 1 illustrates a cross sectional view of a flash memory device containing a zero angstrom oxide interface dual poly gate structure of the flash memory device in accordance with one aspect of the invention.

The invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention.

Exposure of poly layers to an oxygen-containing atmosphere during the manufacturing process of a flash memory device may cause impurities in the layers of the flash memory device. For example, an oxide and/or oxide layer may undesirably form along an upper surface of a poly layer in a core region and/or in a periphery region of the flash memory device when the structure contacts an oxygen-containing atmosphere during the manufacturing process. Such impurities can have a negative impact upon the quality of the resultant flash memory device by altering the desired electrical properties of and interactions between components on the resultant flash memory device. Thus, an efficient system and/or method to form dual poly structures are desirable to increase productivity, quality, and reliability in flash memory device manufacture.

Fabrication of a flash memory device generally involves multiple acts of layer formation. A zero angstrom oxide interface dual poly gate structure in a core region and/or in a periphery region of a flash memory device may include first and second poly layers that are vertically adjacent one another. An oxide and/or oxide layer formed on the first poly layer is removed in a processing chamber by contacting the first poly layer with hydrogen and/or nitrogen and/or other oxide removing ambient, and then the second poly layer is formed on the first poly layer in the same processing chamber. No transfer between processing tools is necessary. As a result, the interface of the two poly layers contains substantially no oxide. That is, a zero angstrom oxide interface is formed. Impurities (e.g., silicon oxide) at the interface have a negative impact on the quality of the resultant flash memory device by altering the desired electrical properties of and interactions between components on the flash memory device. Since the interface of the two poly layers contains substantially no oxide, the negative impact does not occur in accordance with the subject invention.

The subject invention relates to a method and system for processing a zero angstrom oxide interface dual poly gate structure in a core region and/or in a periphery region of a flash memory device. The subject invention also relates to a dual poly gate structure in a core region and/or in a periphery region of a flash memory device with a zero angstrom oxide interface. That is, the interface between two poly layers in the dual poly gate structure contains substantially no oxide compound.

FIG. 1 shows a cross sectional view of a portion of the flash memory device 100. The flash memory device 100 generally contains a substrate 102, and a core region 104 and a periphery region 106 on the substrate 102. The core region 104 may generally contain one or more arrays of memory cell transistors 108 and select gate transistors (not shown).

The periphery region 106 of the flash memory device 100 contains one or more zero angstrom oxide interface dual poly gate structures 110. The zero angstrom oxide interface dual poly gate structure 110 may contain a plurality of transistors containing, for example, a dielectric layer 112, a first poly layer 114, and a second poly layer 116. Other features are not shown for brevity. The dielectric layer 112 may contain a suitable insulator such as an oxide-nitride (ON) bi-layer or an oxide-nitride-oxide (ONO) tri-layer. The poly layers 114, 116 contain polysilicon. The first poly layer 114 can be referred to as a "poly 1," while the second poly layer 116 can be referred to as a "poly 2." Although not shown, the periphery region 106 may generally contain low-voltage transistors for handling logic and switching circuitry, and high-voltage transistors for handling high-voltages encountered during flash memory programming and erase operations.

The poly 1 114 contains polysilicon. If the poly 1 114 contacts an oxygen-containing environment during the manufacturing process, an oxide and/or oxide layer may form along the upper poly 1 surface. The oxide and/or oxide layer may contain silicon oxide. Often times, the thickness of the oxide layer is a function of the time that the poly 1 is exposed to the oxygen-containing environment as well as the amount of oxygen in the oxygen-containing environment. After the poly 1 formation and before a poly 2 is formed on the poly 1 layer, any oxide on the surface of the poly 1 is removed. The oxide is removed by contacting the poly 1 with hydrogen and/or nitrogen and/or other oxide removing ambient in a processing chamber under suitable conditions. As a result, an interface between the two poly layers 114, 116 contains substantially no oxide and/or oxide layer.

Containing substantially no oxide and/or oxide layer at the interface between the two poly layers means that the interface does not contain or is not bound to oxygen that is detectable above the background noise level by a secondary ion mass spectrometer (SIMS). The thickness of the oxide and/or oxide layer at the interface of the two poly layers is below the minimum detectable thickness of oxide using a SIMS, which is the background noise level, meaning that virtually no oxide is at the interface. The interface of the two poly layers contains an oxide layer of thickness of about zero Å (angstrom), or the interface of the two poly layers is substantially free of an oxide. It is to be appreciated that substantially any suitable SIMS that is normally used for determining the thickness of an oxide can be used for the subject invention. In one embodiment, the thickness of the oxide compound at the interface of the two poly layers can be determined using a SIMS under the trade designation PH1-6600 available from PerkinElmer, Inc.

Figure 2:
FIG. 2 shows a cross sectional view of forming a zero angstrom oxide interface dual poly gate structure of a flash memory device in accordance with one aspect of the invention.

FIGS. 2 to 7 illustrate one of many possible exemplary embodiments of processing a zero angstrom oxide interface dual poly gate structure for a flash memory device. FIG. 2 illustrates a substrate 200 of a periphery region of a flash memory device in a processing chamber (not shown). The substrate 200 may be substantially any suitable flash memory substrate such as a silicon substrate.

Figure 3:
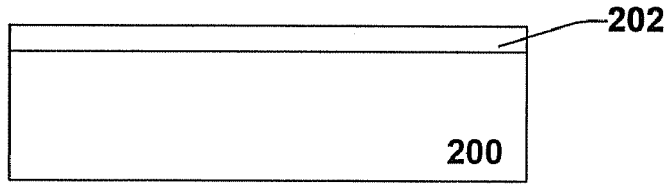
FIG. 3 shows a cross sectional view of forming a zero angstrom oxide interface dual poly gate structure of a flash memory device in accordance with one aspect of the invention.

Referring to FIG. 3, a dielectric layer 202 may optionally be formed on one or more portions of the substrate 200 in the processing chamber. Examples of the dielectric layer 202 may include an ON layer and an ONO layer. It is to be appreciated that although the ON and/or ONO layer is illustrated as one layer, that such a layer may contain multiple layers (e.g., oxide, nitride, oxide). It is to be further appreciated that such oxide and nitride layers can be formed employing suitable techniques including chemical vapor deposition (CVD) and/or thermal oxidation, with an optional patterned mask, followed by an optional etching away and/or etching back one or more portion.

Figure 4:
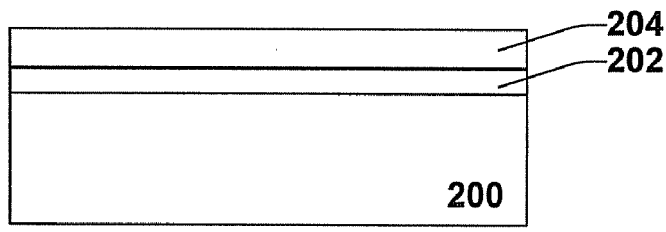
FIG. 4 shows a cross sectional view of forming a zero angstrom oxide interface dual poly gate structure of a flash memory device in accordance with one aspect of the invention.

FIG. 4 illustrates formation of poly 1 204 on one or more portions of the dielectric layer 202 in the processing chamber. The poly 1 204 contains polysilicon. The poly 1 204 may be shared by one or more or all transistors in the periphery region. It is to be appreciated that the poly 1 204 can be formed employing substantially any suitable poly formation techniques including CVD, with an optional patterned mask, followed by an optional etching away and/or etching back one or more portion.

The poly 1 204 has a suitable thickness that depends upon the desired implementations and/or the flash memory device being fabricated. In one embodiment, the thickness of poly 1 204 is about 0.001 micron or more and about 0.1 micron or less. In another embodiment, the thickness of poly 1 204 is about 0.005 microns or more and about 0.05 microns or less. In yet another embodiment, the thickness of poly 1 204 is about 0.01 micron or more and about 0.03 microns or less.

Although not shown, after the poly 1 204 formation, all or portions of the core region and/or periphery region of the flash memory device may be subject to substantially any flash memory device fabrication processes. General examples of the flash memory device fabrication processes include masking, patterning, etching, planarization, thermal oxidation, implant, annealing, thermal treatment, deposition, and the like normally used for making semiconductor devices.

For example, in one embodiment, the poly 1 204 in the periphery region may optionally be etched back by substantially any suitable method, such as by reactive ion etch (RIE). In another embodiment, although not shown, one or more portions of the poly 1 204 may optionally be implanted with oxygen to form one or more portions of a silicon oxide layer in the poly 1 204. Prior to the implantation, a mask such as a patterned photoresist may cover one or more portions of the surface of the poly 1 204. In one embodiment, implantation of oxygen into the poly 1 204 is performed with the patterned mask, thus limiting the region of the implantation of oxygen into the poly 1 204. The presence of a patterned mask layer, coupled with selectively chosen implant energy, dose and angle, results in relatively defined area of formation of silicon oxide layer.

Although not shown, a processing chamber is defined by a housing having a plurality of walls. It is to be appreciated that substantially any suitable type of process chamber can be used for the subject invention. In one embodiment, the processing chamber may be a small volume processing chamber. In another embodiment, the processing chamber may be a big batch processing chamber. In yet another embodiment, the processing chamber may be an epitaxial growth chamber, a CVD chamber, a physical vapor deposition (PVD) chamber, or other commonly available semiconductor processing chamber, with or without appropriate modifications. The processing chamber suitable to the subject invention can be substantially any enclosure associated with one or more gas and/or liquid inlets to deliver gaseous and/or liquid chemicals for forming the poly layers and for removing oxide, and at least one gas and/or liquid outlet for evacuating the enclosure. The processing chamber may have sub-chambers.

In one embodiment, the processing chamber is a small volume processing chamber, not a large batch chamber that can process 100 wafer substrates. In one embodiment, the small volume processing chamber can process about 10 or fewer wafer substrates. In another embodiment, the small volume processing chamber can process about 5 or fewer wafer substrates. In yet another embodiment, the small volume processing chamber can process about 2 or fewer wafer substrates.

Figure 5:
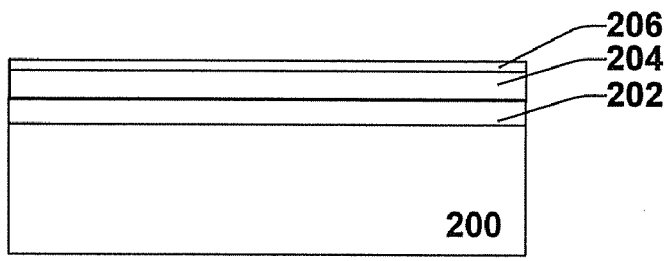
FIG. 5 shows a cross sectional view of forming a zero angstrom oxide interface dual poly gate structure of a flash memory device in accordance with one aspect of the invention.

If the processing chamber contains any oxygen-containing species such as air, an oxide and/or oxide layer 206 tends to grow along the upper poly 1 surface, as illustrated in FIG. 5. Often times, the thickness of the oxide layer 206 is a function of the time that the poly 1 204 is exposed to the oxygen-containing species as well as the amount of oxygen in the oxygen-containing species. After the poly 1 204 formation and before a poly 2 formation on the poly 1 204, the oxide layer 206 on the surface of the poly 1 204 is removed. The oxide layer 206 is removed by contacting the oxide layer 206 with hydrogen and/or nitrogen in the processing chamber under suitable conditions to remove oxide.

The oxide layer 206 is contacted with hydrogen and/or nitrogen in the processing chamber at a suitable temperature to facilitate removing the oxide that depends upon, for example, the thickness of the oxide layer 206, the desired implementations and/or the flash memory device being fabricated. In one embodiment, the oxide layer 206 is contacted with hydrogen and/or nitrogen at a temperature of about 200 degrees Celsius or more and about 950 degrees Celsius or less. In another embodiment, the oxide layer 206 is contacted with hydrogen and/or nitrogen at a temperature of about 400 degrees Celsius or more and about 900 degrees Celsius or less. In yet another embodiment, the oxide layer 206 is contacted with hydrogen and/or nitrogen at a temperature of about 500 degrees Celsius or more and about 850 degrees Celsius or less.

The oxide layer 206 is contacted with hydrogen and/or nitrogen in the processing chamber at a suitable pressure to facilitate removing the oxide that depends upon, for example, the thickness of the oxide layer 206, the desired implementations and/or the flash memory device being fabricated. In one embodiment, the oxide layer 206 is contacted with hydrogen and/or nitrogen at a pressure of about 10 Torr or less. In another embodiment, the oxide layer 206 is contacted with hydrogen and/or nitrogen at a pressure of about 8 Torr or less. In yet another embodiment, the oxide layer 206 is contacted with hydrogen and/or nitrogen at a pressure of about 6 Torr or less.

The oxide layer 206 is contacted with hydrogen and/or nitrogen in the processing chamber for a suitable time to facilitate removing the oxide that depends upon, for example, the thickness of the oxide layer 206, the desired implementations and/or the flash memory device being fabricated. In one embodiment, the oxide layer 206 is contacted with hydrogen and/or nitrogen for about 1 second or more and about 30 minutes or less. In another embodiment, the oxide layer 206 is contacted with hydrogen and/or nitrogen for about 5 seconds or more and about 10 minutes or less. In yet another embodiment, the oxide layer 206 is contacted with hydrogen and/or nitrogen for about 10 seconds or more and about 5 minutes or less.

The processing chamber contains a sufficient amount of hydrogen and/or nitrogen and/or other oxide removing ambient to facilitate removal of the oxide from the poly 1 204. In one embodiment, the processing chamber contains at least about 20% hydrogen and/or nitrogen and/or other oxide removing ambient by volume. In another embodiment, the processing chamber contains at least about 40% hydrogen and/or nitrogen and/or other oxide removing ambient by volume. In yet another embodiment, the processing chamber contains at least about 50% hydrogen and/or nitrogen and/or other oxide removing ambient by volume. The remaining gas(es) may be one or more inert gases such as helium, neon, argon, krypton, xenon, and the like.

Figure 6:
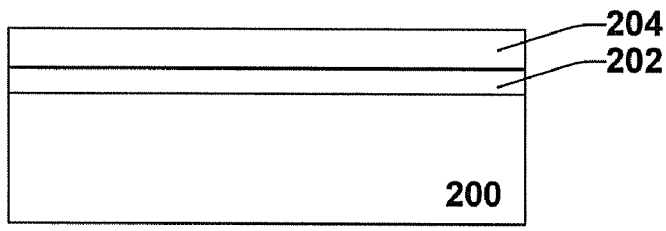
FIG. 6 shows a cross sectional view of forming a zero angstrom oxide interface dual poly gate structure of a flash memory device in accordance with one aspect of the invention.

FIG. 6 illustrates the structure after the oxide layer 206 is removed. There is substantially no oxide on the upper surface of the poly 1 204. Use of a SIMS analysis indicates that the oxygen count is at about the background noise level or less.

Figure 7:
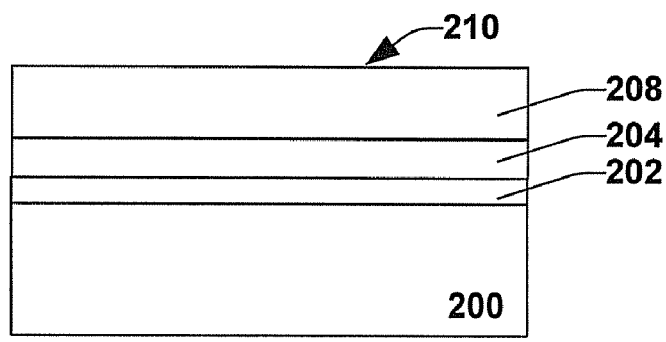
FIG. 7 shows a cross sectional view of a zero angstrom oxide interface dual poly gate structure of a flash memory device in accordance with one aspect of the invention.

FIG. 7 illustrates formation of a poly 2 208 on one or more portions of the poly 1 204 in the processing chamber after the oxide layer 206 is removed, thereby forming a zero angstrom oxide interface dual poly gate structure 210. The poly 2 208 contains polysilicon. The poly 2 208 may be shared by one or more or all transistors in the periphery region. It is to be appreciated that the poly 2 208 can be formed employing substantially any suitable polysilicon formation techniques including CVD, with an optional patterned mask, followed by an optional etching away and/or etching back one or more portion.

The poly 2 208 is formed in the processing chamber at a suitable pressure to facilitate forming the poly layer that depends upon, for example, the thickness of the poly layer, the desired implementations and/or the flash memory device being fabricated. The poly 2 208 may be formed in the processing chamber at a low pressure to mitigate reformation of an oxide and/or oxide layer on the surface of the poly 1 204. In one embodiment, the poly 2 208 is formed at a pressure of about 500 Torr or less. In another embodiment, the poly 2 208 is formed at a pressure of about 200 Torr or less. In yet another embodiment, the poly 2 208 is formed at a pressure of about 100 Torr or less.

The poly 2 208 has a suitable thickness that depends upon the desired implementations and/or the flash memory device being fabricated. In one embodiment, the thickness of poly 2 208 is about 0.01 micron or more and about 1 micron or less. In another embodiment, the thickness of poly 2 208 is about 0.02 microns or more and about 0.5 microns or less. In yet another embodiment, the thickness of poly 2 208 is about 0.05 microns or more and about 0.1 micron or less.

The poly 2 208 may have a thickness greater than, about equal to, or less than the thickness of poly 1 204. In one embodiment, the thickness of poly 2 208 is at least about 10% greater than the thickness of poly 1 204. In another embodiment, the thickness of poly 2 208 is at least about 25% greater than the thickness of poly 1 204. In yet another embodiment, the thickness of poly 2 208 is at least about 50% greater than the thickness of poly 1 204.

The formation of poly 2 208 may occur relatively soon or immediately after removing the oxide layer 206 to mitigate re-formation of an oxide and/or oxide layer on the surface of the poly 1 204 prior to the formation of poly 2 208. In one embodiment, the formation of poly 2 208 starts within about 10 minutes after removing the oxide layer 206. In another embodiment, the formation of poly 2 208 starts within about 1 minute after removing the oxide layer 206. In yet another embodiment, the formation of poly 2 208 starts within about 10 seconds after removing the oxide layer 206.

The poly layers 204, 208 can be formed employing substantially any suitable poly formation techniques including CVD, with an optional patterned mask, followed by an optional etching away and/or etching back one or more portion. For example, an atmospheric pressure CVD (APCVD), low-pressure CVD (LPCVD), plasma-enhanced CVD (PECVD), or high-density plasma (HDP) may be employed. The CVD may introduce a gaseous form of a silicon-containing precursor, such as $SiH_4$, $Si_2H_6$, $Si_3H_8$, $SiF_4$, and the like above the substrate, with an inert gas such as helium and argon optionally being utilized as a carrier gas, through a gas delivery component.

The poly layer formation and oxide removal independently may be performed under an environment other than an oxygen-containing atmosphere such as air over the entire period or any portion of the period. The inert or non-reactive environment may be suitable for facilitating processing the zero angstrom oxide interface dual poly gate structure. For example, the chamber may contain an inert gas such as one or more of helium, neon, argon, krypton, xenon, and the like. The poly 1 204 is not exposed to the oxygen-containing atmosphere after removing oxide on the poly 1 204 and before the poly 2 208 is formed, thus not causing impurities at the interface between the poly 1 204 and poly 2 208, and improving, quality, and reliability of the flash memory devices.

In one embodiment, any portion of or the entire of the poly layer formation and oxide removal independently may be performed under an inert atmosphere and less than about 0.001% oxygen by volume. In another embodiment, any portion of or the entire of the poly layer formation and oxide removal independently may be performed under an inert atmosphere and less than about 0.0005% oxygen by volume. In yet another embodiment, any portion of or the entire of the poly layer formation and oxide removal independently may be performed under an inert atmosphere and less than about 0.0001% oxygen by volume.

Figure 8:
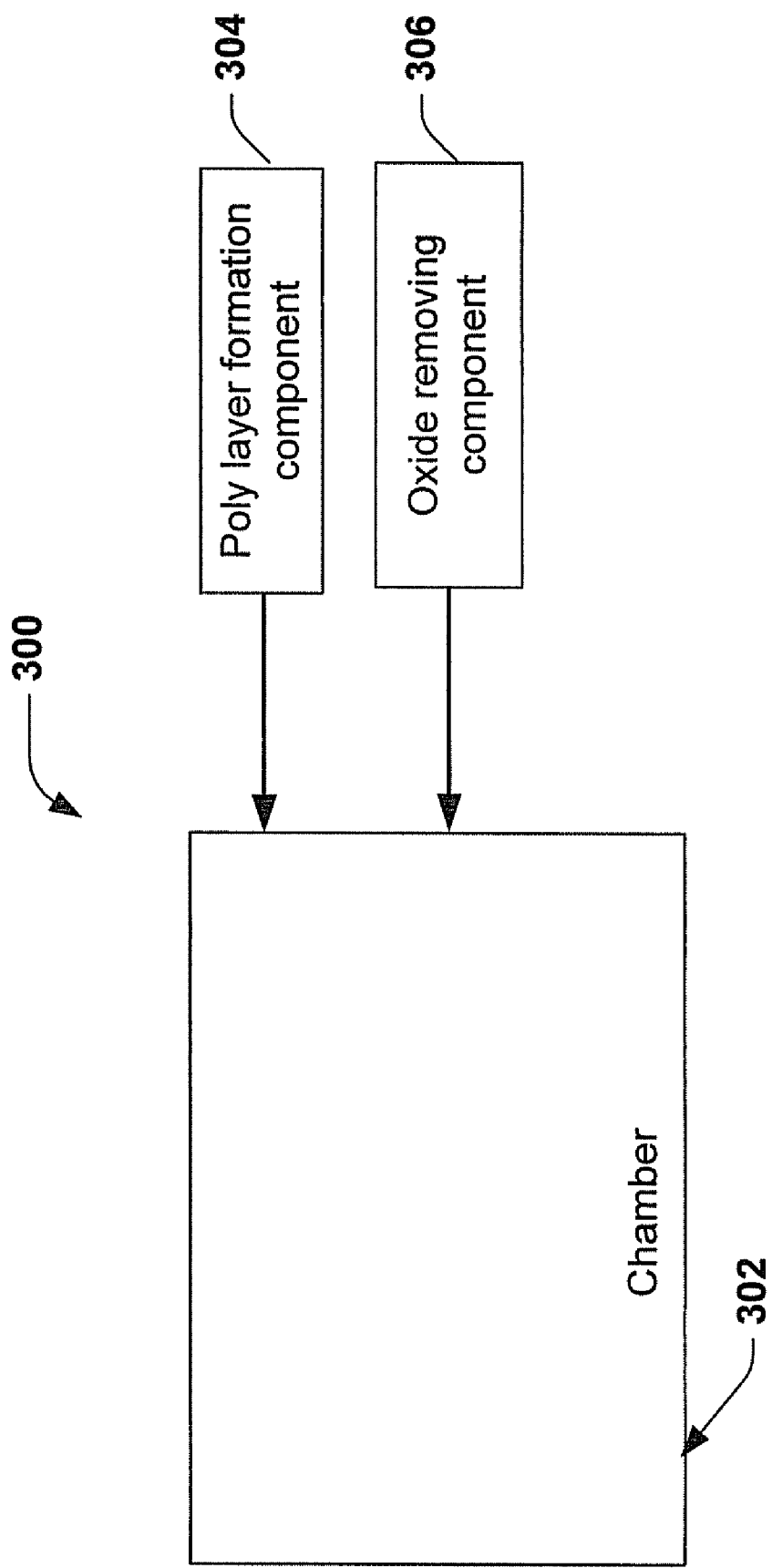
FIG. 8 shows a schematic block diagram of a system for processing a zero angstrom oxide interface dual poly gate structure for a flash memory device in accordance with one or more aspects of the subject invention.

FIG. 8 illustrates a schematic block diagram of a system 300 for processing a zero angstrom oxide interface dual poly gate structure for a flash memory device. The system 300 facilitates fabricating a zero angstrom oxide interface dual poly gate structure containing at least two poly layers. The zero angstrom oxide interface dual poly gate structure has substantially no oxide interface layer between the poly layers. The system 300 includes a processing chamber 302 defined by a housing having a plurality of walls. The system 300 includes one or more poly layer formation components 304 associated with the chamber 302 operative to form a poly layer on one or more portions of a substrate in the chamber 302, and one or more oxide removing components 306 associated with the chamber 302 operative to contact the poly layer with hydrogen and/or nitrogen to remove an oxide on the poly layer in the chamber 302.

It is to be appreciated that substantially any suitable type of process chamber 302 can be used for the subject invention. For example, the chamber 302 may be a CVD chamber, a PVD chamber, or other commonly available semiconductor processing chamber, with or without appropriate modifications. The processing chamber 302 can be substantially any enclosure associated with one or more gas and/or liquid inlets to deliver gaseous and/or liquid chemicals for forming the poly layer and for removing an oxide on the surface of the poly layer, and at least one gas and/or liquid outlet for evacuating the enclosure. The processing chamber 302 may be a single- or multiple-wafer chamber. The processing chamber 302 may have subchambers.

One or more poly layer formation components 304 can be employed associated with the processing chamber 302. The poly layer formation component 304 may include a monitoring and controlling component that facilitates, among other things, depositing the poly layer to a desired thickness on one or more portions of the substrate. The poly layer formation components 304 may be, for example, a CVD component. It is to be appreciated that substantially any suitable poly layer formation components 304 may be employed with the subject invention. For example, components that use PVD techniques, oxidation techniques, or gas phase reactions may be employed in accordance with the subject invention. Choice of a suitable poly layer formation component 304 depends primarily on the identity of the precursor material of the poly layer, size of substrates being processed, and to some extent, the composition of a substrate and/or dielectric layer. It is to be appreciated that each of the various poly layer formation components 304 has its own set of features and characteristics in the art.

A poly layer formation CVD component generally includes a CVD reactor and a gas delivery system having conduits for delivery of gases to the chamber 302. Substantially any suitable poly layer formation components 304 using CVD techniques may be employed with the subject invention. For example, an atmospheric pressure CVD (APCVD), low-pressure CVD (LPCVD), plasma-enhanced CVD (PECVD), or high-density plasma (HDP) may be employed.

In one embodiment, a poly layer formation component 304 may be a PECVD. The PECVD typically comprises a plasma-generating component and a gas delivery component. The PECVD may introduce a gaseous form of a silicon-containing precursor, such as $SiH_4$, $Si_2H_6$, $Si_3H_8$, $SiF_4$, and the like above the substrate, with an inert gas such as helium and argon optionally being utilized as a carrier gas, through the gas delivery component.

One or more oxide removing components 306 can be employed associated with the processing chamber 302 to contact the poly layer with hydrogen and/or nitrogen and/or other oxide removing ambient to remove an oxide and/or oxide layer on the poly layer. An oxide removing component 306 generally includes a hydrogen- and/or nitrogen- and/or other oxide removing ambient-supplying component and a gas delivery component having conduits for delivery of hydrogen and/or nitrogen and/or other oxide removing ambient to the chamber 302. The oxide removing component 306 may include a monitoring and controlling component that facilitates, among other things, removing the oxide on the poly layer. It is to be appreciated that substantially any suitable oxide removing components 306 may be employed with the subject invention. The oxide removing component 306 may include, for example, a hydrogen cylinder and/or a nitrogen cylinder. The oxide removing component 306 introduces hydrogen and/or nitrogen into the processing chamber 302 to contact the poly layer with the hydrogen and/or nitrogen under suitable conditions to remove an oxide on the poly layer.

The oxide removing components 306 contact the poly layer with hydrogen and/or nitrogen in the processing chamber 302 at suitable conditions to facilitate removing the oxide on the poly layer. The conditions generally depend upon, for example, the thickness of the oxide layer, the desired implementations and/or the flash memory device being fabricated. In one embodiment, the poly layer is contacted with hydrogen and/or nitrogen at a temperature of about 200 degrees Celsius or more and about 950 degrees Celsius or less, at a pressure of about 10 Torr or less, and for about 1 second or more and about 30 minutes or less.

A poly layer formation component 304 and oxide removing component 306 independently may perform the dual poly gate structure formation processes under environment other than an oxygen-containing atmosphere such as air in the processing chamber 302. The inert or non-reactive environment may be suitable for facilitating processing the zero angstrom oxide interface dual poly gate structure. For example, the chamber 302 may contain an inert gas such as one or more of helium, neon, argon, krypton, xenon, and the like. As a result, the poly layer is not exposed to the oxygen-containing atmosphere after formation of the poly 1 and before the formation of the poly 2, thus not causing impurities at the interface between the poly 1 and poly 2, and improving, quality, and reliability of the flash memory devices. Even if the chamber 302 has subchambers, the layers are not exposed to air because the substrate is not transferred from a subchamber to another subchamber with an air break. The enclosing chamber 302 with subchambers excludes the air.

In one embodiment, the chamber 302 contains an inert atmosphere and less than about 0.001% oxygen by volume. In another embodiment, the chamber 302 contains an inert atmosphere and less than about 0.0005% oxygen by volume. In yet another embodiment, the chamber 302 contains an inert atmosphere and less than about 0.0001% oxygen by volume.

A poly layer formation component 304 and an oxide removing component 306 may independently perform the optional heat treatment/annealing under an inert or non-reactive environment other than an oxygen-containing environment. For example, the chamber 302 in which heating takers place may contain an inert gas such as one or more of helium, neon, argon, krypton, xenon, and a mixture thereof.

A poly layer formation component 304 generally includes a delivery component which is operatively coupled to the chamber 302 for selectively providing gaseous and/or liquid chemicals into the chamber 302 at various rates, volumes, concentrations, etc. based upon, among other things, the amount (thickness) of layer(s) to be formed, the composition of layer(s) to be formed, the pressure within the chamber 302, the temperature within the chamber 302 and/or the size of the chamber 302, for example. An oxide removing component 306 generally includes a delivery component which is operatively coupled to the chamber 302 for selectively providing gaseous and/or liquid chemicals into the chamber 302 at various rates, volumes, concentrations, etc. based upon, among other things, the amount (thickness) of layer(s) to be removed, the composition of layer(s) to be removed, the pressure within the chamber 302, the temperature within the chamber 302 and/or the size of the chamber 302, for example.

By way of illustration, the gas delivery components include one or more sources of gaseous medium (a vapor) of one or more chemical(s). In one example, the gases may be provided into the chamber 302 through a conduit that terminates in a nozzle (not shown). It is to be appreciated that more than one nozzle or other gas delivery mechanisms may be utilized to provide gas into the chamber 302 at various mixtures and/or concentrations in accordance with one or more aspects of the subject invention. For example, a shower head type gas delivery mechanism can be implemented to more evenly provide chemicals into the chamber 302 above the substrate, which can facilitate a more uniform chemical vapor deposition and/or a more uniform oxide removal on and across the substrate. An inert or non-reactive gaseous can also be provided into the chamber 302 to avoid oxygen exposure of the poly layer after the removal of the oxide on the surface of the poly layer.

Although not shown, the system 300 may contain substantially any component for processing all or portions of the core region and/or periphery region of the flash memory devices. For example, the system 300 may contain substantially any components for masking, patterning, etching, planarization, thermal oxidation, implant, annealing, thermal treatment, deposition, and the like normally used for semiconductor devices.

Figure 9:
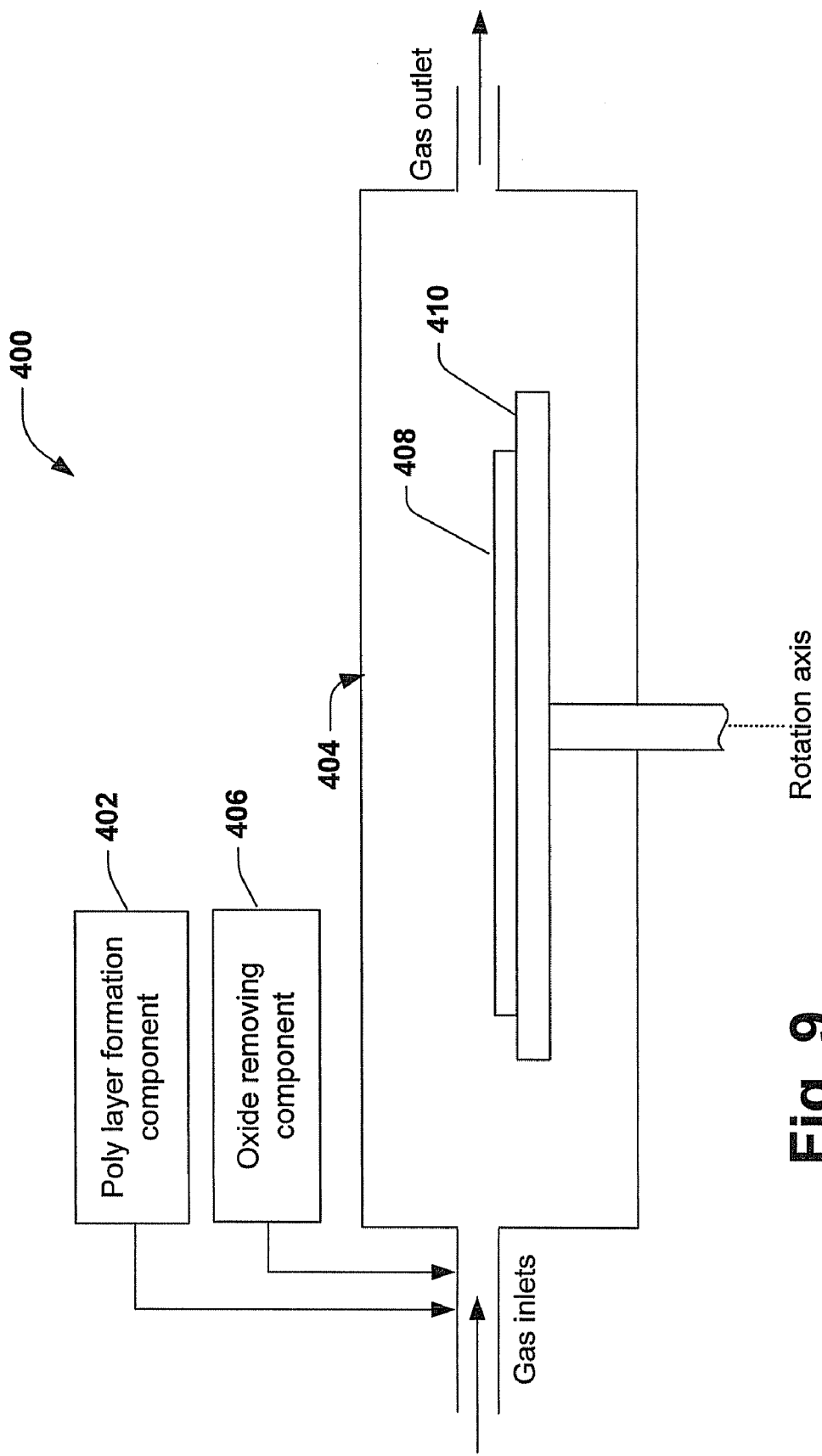
FIG. 9 shows a schematic block diagram illustrating a processing chamber of a system for processing a zero angstrom oxide interface dual poly gate structure for a flash memory device associated with a poly layer formation component and an oxide removing component in accordance with one or more aspects of the subject invention.

FIG. 9 shows a schematic block diagram illustrating a system 400 for processing a zero angstrom oxide interface dual poly gate structure for a flash memory device. The system facilitates fabricating a zero angstrom oxide interface dual poly gate structure containing at least two poly layers. The zero angstrom oxide interface dual poly gate structure has substantially no oxide interface layer between the poly layers. The system 400 includes one or more poly layer formation components 402 associated with a chamber 404 operative to form a poly layer on one or more portions of a substrate, and one or more oxide removing components 406 associated with the chamber 404 operative to contact the poly layer with hydrogen and/or nitrogen to remove an oxide and/or oxide layer on the surface of the poly layer.

The processing chamber 404 is configured for receiving and processing a substrate 408 in a predefined manner. The chamber 404 may have a cylindrical sidewall that may enclose a rotatable chuck 410 onto which the substrate 408 is mounted for processing. The chuck 410 may include a vacuum system (not shown) for holding the substrate 408 on its surface during processing. The chamber 404 has gas inlets for conveying gases to the chamber 404 and a gas outlet for removing gases from the chamber 404. The inlets are connected to the poly layer formation component 402 and the oxide removing component 406.

In one embodiment, the poly layer formation component 402 may be a PECVD. The PECVD typically comprises a plasma-generating component and a gas delivery component. The PECVD may introduce a gaseous form of a silicon-containing precursor, such as $SiH_4$, $Si_2H_6$, $Si_3H_8$, $SiF_4$, and the like above the substrate, with an inert gas such as helium and argon optionally being utilized as a carrier gas, through the gas delivery component.

In one embodiment, the oxide removing component 406 may include a hydrogen and/or nitrogen-supplying component and a gas delivery component having conduits for delivery of hydrogen and/or nitrogen to the chamber 404. The oxide removing component 406 provides the chamber 404 with hydrogen and/or nitrogen through the gas delivery component and gas inlet to remove an oxide and/or oxide layer that is present on the surface of the poly layer. In one embodiment, the poly layer is contacted with hydrogen and/or nitrogen for a time from about 1 minute to about 5 minutes at a temperature from about 400 degrees Celsius to about 850 degrees Celsius and at a pressure of about 6 Torr or less.

Although not shown, the system 400 may contain substantially any components for processing the core region and/or periphery region of the flash memory devices. For example, the system may contain substantially any components for masking, patterning, etching, planarization, thermal oxidation, implant, annealing, thermal treatment, deposition, and the like normally used for semiconductor devices.

Figure 10:
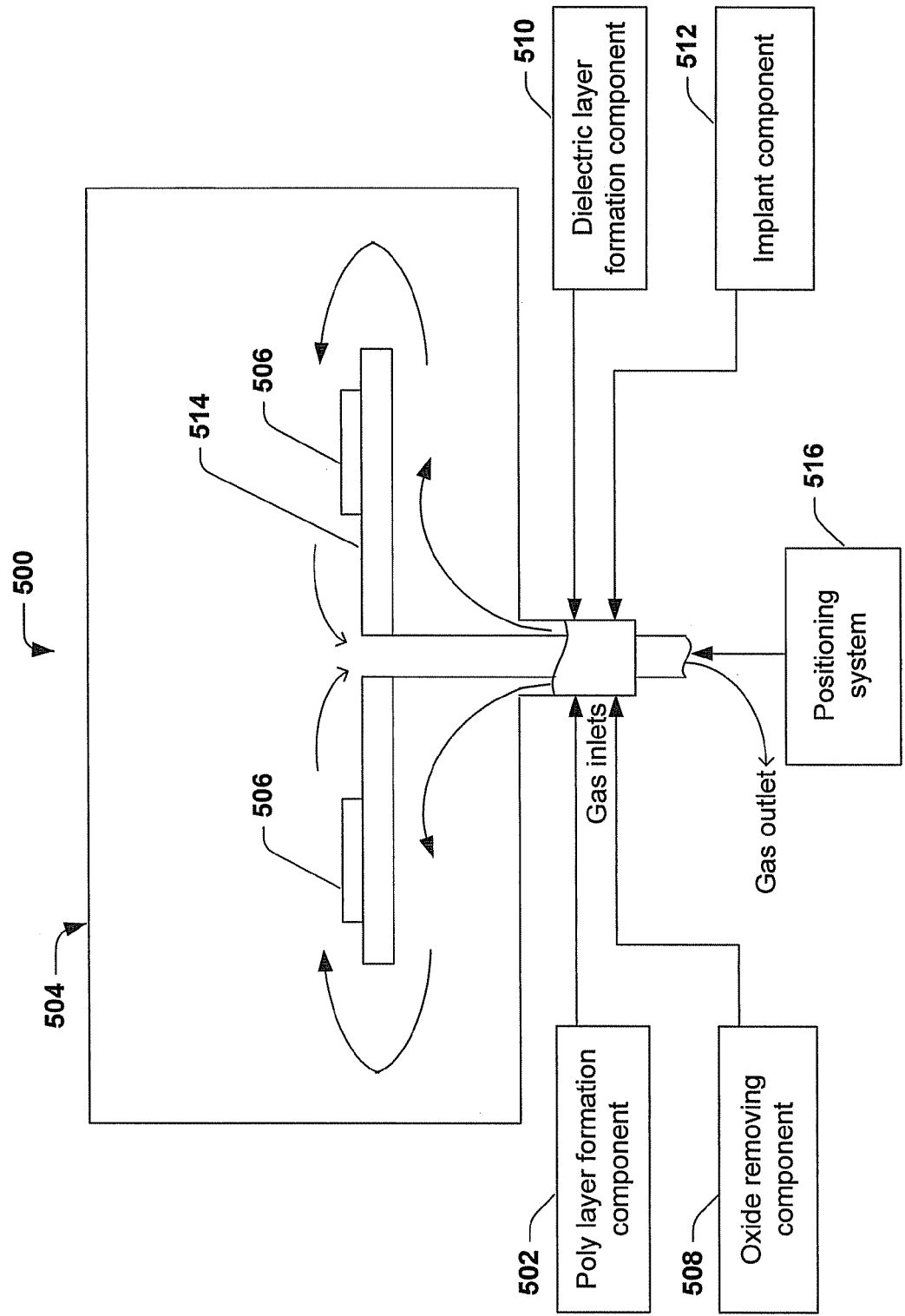
FIG. 10 shows a schematic block diagram illustrating a processing chamber of a system for processing a zero angstrom oxide interface dual poly gate structure for a flash memory device associated with a poly layer formation component, an oxide removing component, a dielectric layer formation component, and an implant component in accordance with one or more aspects of the subject invention.

FIG. 10 shows a schematic block diagram illustrating a system 500 for processing a zero angstrom oxide interface dual poly gate structure for a flash memory device. The system facilitates fabricating a zero angstrom oxide interface dual poly gate structure containing at least two poly layers. The zero angstrom oxide interface dual poly gate structure has substantially no oxide interface layer between the poly layers.

The system 500 includes 1) one or more poly layer formation components 502 associated with a chamber 504 operative to form a poly layer on one or more portions of a substrate 506, 2) one or more oxide removing components 508 associated with the chamber 504 operative to contact the poly layer with hydrogen and/or nitrogen to remove an oxide and/or oxide layer on the surface of the poly layer, 3) one or more dielectric layer formation components 510 associated with the chamber 504 operative to form one or more potions of a dielectric layer on the substrate 506, and 4) one or more implant components 512 associated with the chamber 504 operative to implant oxygen into the poly layer on the substrate 506.

The processing chamber 504 is configured for receiving and processing multiple wafer substrates 506 in a predefined manner. The chamber 504 may have a cylindrical sidewall that may enclose a rotatable chuck 514 onto which multiple substrates 506 are mounted for processing. A positioning system 516 may be operatively connected to the rotatable chuck 514 for selectively maneuvering the substrates 506 into desired positions within the chamber 504. The chuck 514 typically includes a vacuum system (not shown) for holding the substrates on its surface during processing. The chamber 504 has gas inlets for conveying gases to the chamber 504 and a gas outlet for removing gases from the chamber 504. The poly layer formation component 502, the oxide removing component 508, the dielectric layer formation component 510, and the implant component 512 are connected to the gas inlets of the chamber 504.

Although not shown, the system 500 may contain substantially any components for processing the core region and/or periphery region of flash memory devices. For example, the system may contain substantially any components for masking, patterning, etching, planarization, thermal oxidation, implant, annealing, thermal treatment, deposition, and the like normally used for semiconductor devices.

The flash memory devices containing the zero angstrom oxide interface dual poly gate structure in accordance with the subject invention are useful in substantially any electric components. For example, the flash memory devices are useful in computers, appliances, industrial equipment, hand-held devices, telecommunications equipment, medical equipment, research and development equipment, transportation vehicles, radar/satellite devices, and the like. Examples of hand-held devices include cell phones and other two way communication devices, personal data assistants, palm pilots, pagers, notebook computers, remote controls, recorders (video and audio), radios, small televisions and web viewers, cameras, and the like.

With respect to any figure or numerical range for a given characteristic, a figure or a parameter from one range may be combined with another figure or a parameter from a different range for the same characteristic to generate a numerical range.

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

In particular regard to the various functions performed by the above described components (assemblies, devices, circuits, etc.), the terms (including substantially any reference to a "means") used to describe such components are intended to correspond, unless otherwise indicated, to substantially any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for substantially any given or particular application.

What is claimed is:

1. A method for forming a zero angstrom oxide interface dual poly gate structure for a flash memory device comprising a core region and a periphery region on a substrate, the method comprising:

forming a dielectric layer over the substrate only in the periphery region;

forming a first poly layer over the dielectric layer only in the periphery region;

contacting the first poly layer with an oxide removing ambient that consists of at least 20% nitrogen and remaining gases selected from a group consisting of helium, neon, argon, krypton, xenon, and combinations thereof at a temperature of 500 degrees Celsius or more and 850 degrees Celsius or less, at a pressure of about 6 Torr or less, and for about 10 seconds or more and about 5 minutes or less to remove an oxide and/or oxide layer on the first poly layer in the processing chamber; and forming a second poly layer over the first poly layer in the processing chamber, wherein an interface of the first poly layer and the second poly layer comprises substantially no oxide.

2. The method of claim 1, further comprising:
forming a portion of a silicon oxide layer in the first poly layer.

3. The method of claim 1, further comprising:
forming a patterned photoresist over the first poly layer; and
implanting oxygen in the first poly layer.

4. The method of claim 1, wherein the dielectric layer is formed over the substrate so that the upper surface of the substrate is in contact with the bottom surface of the dielectric layer, and the first poly layer is formed over the dielectric layer so that the upper surface of the dielectric layer is in contact with the bottom surface of the first poly layer.

* * * * *